(12) United States Patent
Odashima et al.

(10) Patent No.: US 8,178,024 B2
(45) Date of Patent: May 15, 2012

(54) INJECTION MOLDING DIE AND INJECTION MOLDING METHOD

(75) Inventors: Satoshi Odashima, Saitama (JP); Hidehiro Masuko, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 252 days.

(21) Appl. No.: 12/525,980

(22) PCT Filed: Feb. 20, 2008

(86) PCT No.: PCT/JP2008/052854
§ 371 (c)(1),
(2), (4) Date: Aug. 5, 2009

(87) PCT Pub. No.: WO2008/102804
PCT Pub. Date: Aug. 28, 2008

(65) Prior Publication Data
US 2010/0314797 A1 Dec. 16, 2010

(30) Foreign Application Priority Data
Feb. 21, 2007 (JP) .................. 2007-041109

(51) Int. Cl.
*B29C 33/14* (2006.01)
*B29C 45/14* (2006.01)
(52) U.S. Cl. ....................... 264/275; 264/279; 425/129.1
(58) Field of Classification Search ................... 264/278, 264/274, 275, 279; 425/192 R, 127–129.1
See application file for complete search history.

(56) References Cited

U.S. PATENT DOCUMENTS

| 4,348,003 A * | 9/1982 | Beneteau ................... 425/129.1 |
| 5,753,151 A * | 5/1998 | McBride ....................... 264/1.9 |
| 6,382,419 B1 | 5/2002 | Fujimori et al. |
| 6,871,741 B2 | 3/2005 | Bhatt et al. |
| 2006/0283774 A1* | 12/2006 | Hasegawa et al. ............ 206/725 |

FOREIGN PATENT DOCUMENTS

| JP | 11-156887 A | 6/1999 |
| JP | 11-168136 A | 6/1999 |
| JP | 2001-150479 A | 6/2001 |
| JP | 2002-187171 A | 7/2002 |

(Continued)

OTHER PUBLICATIONS

Electronic translation of JP 2003-68839.*
Electronic translation of Japanese reference JP 2006-100712.*
Rosato et al., Injection Molding Handbook, 3rd edition, date 2000, pp. 751-759 and 1252-1255.*
International Search Report issued in PCT/JP2008/052854, mailed on May 1, 2008, with translation (4 pages).

*Primary Examiner* — Jill Heitbrink
(74) *Attorney, Agent, or Firm* — Osha • Liang LLP (57) ABSTRACT

A die is formed of a cavity mold having a hollow portion and a slidable core mold that allows a core to be inserted into hollow portion of cavity mold. An insert part that has been previously molded is fitted to and supported by the front end of core of core mold. Then, insert part is inserted into die and clamped therein, then a molten molding material is injected into die so as to perform injection molding of a container body of a substrate storage container with its rear part formed with insert part. Since insert part is put into contact with hollow portion of cavity core so as to restrain vibration of tapering flat core, core of core mold will not be flapped or flexed even if difference in injection pressure occurs in the molding material.

9 Claims, 10 Drawing Sheets

FOREIGN PATENT DOCUMENTS

| | | | |
|---|---|---|---|
| JP | 2003-68839 | * | 3/2003 |
| JP | 2006-100712 A | | 4/2006 |
| JP | 2006-281463 A | | 10/2006 |

* cited by examiner

INJECTION MOLDING DIE AND INJECTION MOLDING METHOD

TECHNICAL FIELD

The present invention relates to an injection molding die and injection molding method suitable for molding various molding articles such as container bodies etc., of substrate storage containers called SMALL FOUP.

BACKGROUND ART

Sliced thin semiconductor wafers having a diameter of 200 mm or 300 mm are subjected to various processes. The processing time of the semiconductor wafers is not uniquely determined, but varies not a little depending on the IC chip performance, the season for development into products, specifications of the products and the like.

For example, when semiconductor wafers are processed at a memory device manufacturer or the like, especially when the object to be processed is a multipurpose item, mass production is required, so that the manufacturing process includes many steps and is carried out over a long period (e.g., 30 days to 40 days). In contrast, when semiconductor wafers are processed at an LSI manufacturer or the like, it is necessary to deal with a demand for low-volume diversified production, trial manufacture of prototypes and products in small lots. Accordingly, the processing is required to be done within a short period (e.g., 14 days to 20 days).

Accordingly, when semiconductor wafers are processed at LSI manufactures etc., it is preferable to accommodate a few (e.g., one to three) wafers in a dedicated substrate storage container, instead of an existing substrate storage container capable of accommodating a plurality (e.g., 25, 26 pieces) of wafers, to thereby reduce the processing time per each (see patent document 1).

As the substrate storage container of this kind, a configuration including an unillustrated container body that is laterally long when viewed from the front and a laterally long door element for opening and closing the open front of the container body has been under consideration. As a manufacturing method of the container body, an injection molding process for molding the container body by injecting a molten molding material into a die made of a cavity mold and a core mold clamped together is considered, aiming at economic mass production and high-quality development (see patent document 2).
Patent Document 1:
Japanese Patent Application Laid-open 2006-100712
Patent Document 2:
Japanese Patent Application Laid-open H11-168136

DISCLOSURE OF INVENTION

Problems to be Solved by the Invention

However, when molding material is simply injected into the clamped die of a cavity mold and a core mold, the core of the core mold inserted into the cavity mold is flapped (swayed) due to difference in injection pressure of the inflow molding material. As a result, there occur the problems that variation in the wall thickness of the container body occurs depending on the positions, the top and bottom, left and right and that the core of the core mold sways, resulting in breakage.

The present invention has been devised in view of the above, it is therefore an object of the invention to provide an injection molding die and an injection molding method which can suppress variation in the wall thickness of a molding article and also suppress breakage of a mold.

Means for Solving the Problems

In order to solve the above problems, the present invention resides in a die for molding a hollow molding article that has, at least, part of externals formed with an insert part, by inserting the insert part into the die, clamping the die, and injecting a molding material into the mold-clamped die, and the die includes: a first mold having a hollow portion and a second mold with a core fitted into the hollow portion of the first mold, and is characterized in that the insert part is supported by the core of the second mold and brought into contact with the hollow portion of the first mold to restrain the core of the second mold from being flapped when the molding material is injected.

Here, mating anti-shift portions may be formed in the contact area between the hollow portion of the first mold and the insert part.

Also, anti-shift portions may be formed in the contact area between the core of the second mold and the insert part.

Also, it is possible to support the insert part by forming one or plural ventilation holes in the front end of core that communicate (make air to flow) with an external ventilation equipment and reducing the pressure of air using the ventilation holes.

It is also possible to release the mold from the molding article by forming one or plural ventilation holes in the front end of core that communicate (make air to flow) with an external ventilation equipment and supplying pressurized air using the ventilation holes.

The molding article may be a container body of a front open box type capable of accommodating three substrates or less, and the rear part of the container body, which partly includes a see-through backside wall, may be formed by the insert part.

Further, the insert part may be molded of a molding material containing transparent resin into a shape that is fittable to the core of the second mold.

In order to solve the above problems, the present invention resides a method for molding a hollow molding article, at least part of externals of which is formed with an insert part, using an injection molding die defined in any one of above claims 1 to 5.

Herein, the die defined in the scope of the claims is not particularly limited as long as it is a type that is suited to insert molding and injection molding. This die may be one for either vertical arrangement or horizontal arrangement. The insert parts may include a form that has, at least, an approximately C-shaped, U-shaped or V-shaped section. It does not matter whether it is formed of metal or resin.

The hollow molding article may, at least, include a form that has an approximately hollow square or U-shaped section. As this molding article, other than the container body accommodating a few substrates, various parts, cases, housings, carriers and the like, which are used in the fields of mechanics, electricity, electronics, communications, chemistry, medical service and transportation equipment. The core of the second mold is mainly of an approximately flat type, but is not necessarily limited thereto. Further, the substrates at least include aluminum discs, semiconductor wafers, quartz glass, liquid crystal glass, etc. of various sizes.

According to the present invention, since, when a molding article is formed, the insert part is supported by the core of the second mold and this insert part is brought into contact with the hollow portion of the first mold to restrain the core from being flexed etc., it is possible to suppress the core of the second mold that is clamped to the first mold, from being flapped even if there occurs a difference of injection pressure in the molding material.

Effect of the Invention

According to the present invention, since the insert part is supported by the core of the second mold and this insert part is brought into contact with the hollow portion of the first mold, this invention is effective in suppressing variation in the wall thickness of the molding article and also breakage of the mold.

Further, when the molding article is a container body of a front open box type capable of accommodating three substrates or less, and the rear part of the container body, which partly includes a see-through backside wall, is formed by the insert part, it is possible to prevent occurrence of variation in the wall thickness of the molded container body.

Moreover, when the insert part is molded into a shape that is fittable to the core of the second mold, it is possible to stabilize the posture of the insert part during molding. Accordingly, it is possible to form a molding article in high quality.

DESCRIPTION OF REFERENCE NUMERALS

1 Die
2 Cavity mold (the first mold)
3 Hollow portion
4 Opposing wall
6 Core mold (the second mold)
7 Core
10 Insert part
20 Substrate storage container
21 Container body (hollow molding article)
34 Backside wall
35 Observation window (see-through part)
36 Rear part (part of externals)
37 Teeth
40 Door element
50 Gasket
60 Joint piece
70 Anti-shift portion
70A Anti-shift portion
W Semiconductor wafer (substrate)

BEST MODE FOR CARRYING OUT THE INVENTION

Referring next to the drawings, the preferred embodiment mode of the present invention will be described. As shown in FIGS. 1 to 7, in the injection molding die in the present embodiment, a die 1 is formed of a cavity mold 2 and a slidable core mold 6 that is inserted into this cavity mold 2. An insert part 10 is supported on a core 7 of this core mold 6. The die 1, into which insert part 10 is inserted, is clamped, then a predetermined molding material is injected into die 1 so as to perform injection molding of a container body 21 of a substrate storage container 20 in which part of externals is formed by insert part 10.

Figure 1:
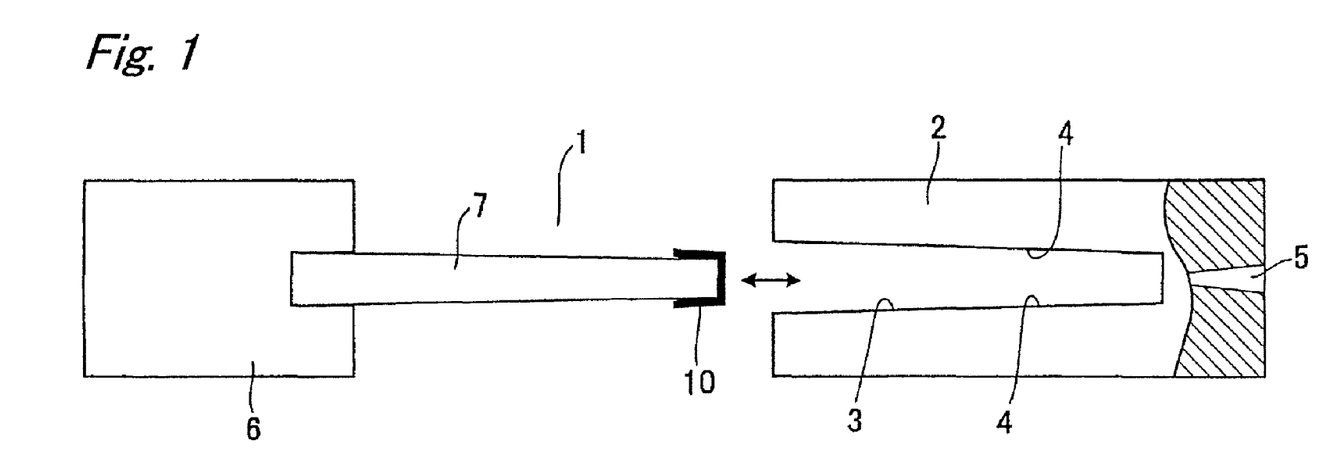
FIG. 1 is a partly sectional illustrative view schematically showing an embodiment of an injection molding die and injection molding method according to the present invention.

Cavity mold 2 and core mold 6 of die 1 are coupled opposing each other in an unillustrated injection molding machine, and core mold 6 moves forwards and backwards in a horizontally separable manner relative to cavity mold 2. Cavity mold 2 and core mold 6 of this die 1 are each formed with a cooling water way for temperature adjustment. This cooling water way functions to circulate water of a fixed temperature.

As shown in FIG. 1, cavity mold 2 is given in the form of a female mold having a hollow portion 3 for forming the external form of container body 21 of substrate storage container 20, and is joined to the fixed side of the molding machine by means of an adapter plate. This cavity mold 2 may be either a split mold type or an integral type. Cavity mold 2 is formed with a sprue 5 having an approximately conical section that directly contacts with the nozzle of the molding machine. A plurality of (four, for example) runners that distribute the molten molding material in a well-balanced manner to mirror-polished hollow portion 3 are connected to this sprue 5. At a downstream portion of each runner, a gate through which the molten molding material is injected to hollow portion 3 is connected.

Figure 2:
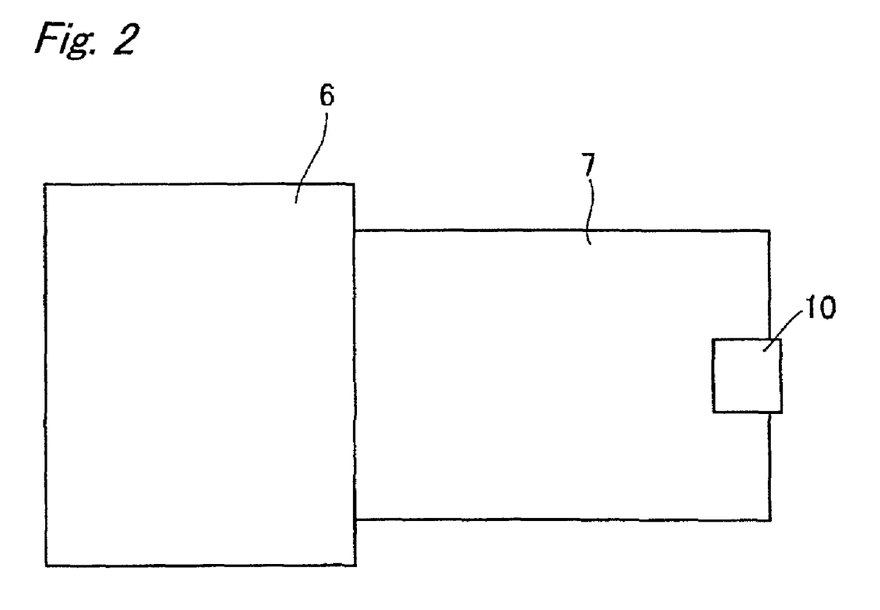
FIG. 2 is an illustrative view schematically showing a core mold in an embodiment of an injection molding die and injection molding method according to the present invention.

As shown in FIGS. 1 and 2, core mold 6 is given in the form of a male mold having a mirror-polished core 7 that is inserted into hollow portion 3 of cavity mold 2 to form the interior surface of container body 21, and is joined to the moving side of the molding machine by means of an adaptor plate. Core 7 is given in the form of a basically elongated and tapering flat plate made of a kind of steel, and a depressed portion for positioning and supporting an insert part 10 is formed at the insert part attachment position at its front end. The core is screw-fixed to core mold 6 by fasteners.

Here, a ventilation hole communicating with a negative-pressure source as external ventilation equipment is formed at the insert part attachment position at the front end of core 7. Vacuum suction of air from this ventilation hole enables reliable support of insert part 10. It is also possible to improve the performance of mold release of container body 21 when container body 21 is released from the mold, by supplying pressurized air to the ventilation hole of core 7.

As shown in the same figure, insert part 10 has been previously formed of a molding material containing transparent resin, in a shape fittable to the front end of core 7 that is screw fitted to core 6, e.g., in a shape having an approximately U-shaped section, and is placed in contact with opposing wall 4 of hollow portion 3 when container body 21 is molded, to thereby constitute a rear part 36 of container body 21 having a partly see-through backside wall 34. As the molding material for this insert part 10, material of polycarbonate, having superior transparency, heat resistance and impact resistance, with carbon, carbon fiber, carbon nanotube, metal fiber, metal oxide, conductive high polymers and/or the like added therein, may be considered.

As shown in FIGS. 3 to 7, substrate storage container 20 includes open-box type container body 21 that is laterally long when viewed from the front, a laterally long door element 40 for opening and closing the open front of this container body 21 and an elastic gasket 50 interposed between these container body 21 and door element 40, and accommodates, for example two semiconductor wafers W of 300 mm in diameter, in alignment.

Container body 21 and door element 40 may be molded of a molding material of, for example polycarbonate, polybutylene terephthalate, cycloolefin polymer, polyether imide, polyether etherketone, or the like, in which carbon, carbon fiber, carbon nanotube, metal fiber, metal oxide, conductive high polymers and/or the like are added.

Container body 21 is given in the form of an opaque front-open box type formed by injection molding using a predetermined molding material, with the ratio of the long side to the short side of the front specified within the range from 1.6 to 25, forming a space enough to accommodate two semiconductor wafers W in alignment. As shown in FIGS. 3 to 7, this container body 21 is integrally formed with a bottom plate 22 that is extended horizontally outwards at the bottom. The periphery of this bottom plate 22 is bent upward so as to provide a reinforcing function.

Figure 3:
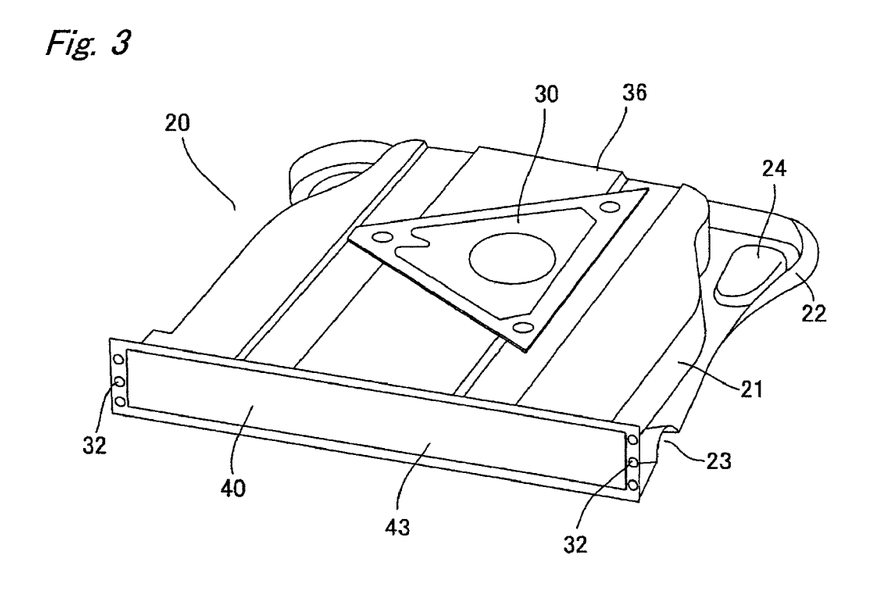
FIG. 3 is an overall perspective view schematically showing a substrate storage container in an embodiment of an injection molding die and injection molding method according to the present invention.

As shown in the same figure, positioning grooves 23 for positioning relative to unillustrated semiconductor processing equipment are curvedly formed so as to have an approximately U-shaped or approximately V-shaped section, at the center in the rear and at both sides on the front side. Further, as shown in FIGS. 3, 5 and 6, weights 24 functioning as counter weights or balancers for door element 40 are embedded at both sides in the rear of bottom plate 22.

Figure 5:
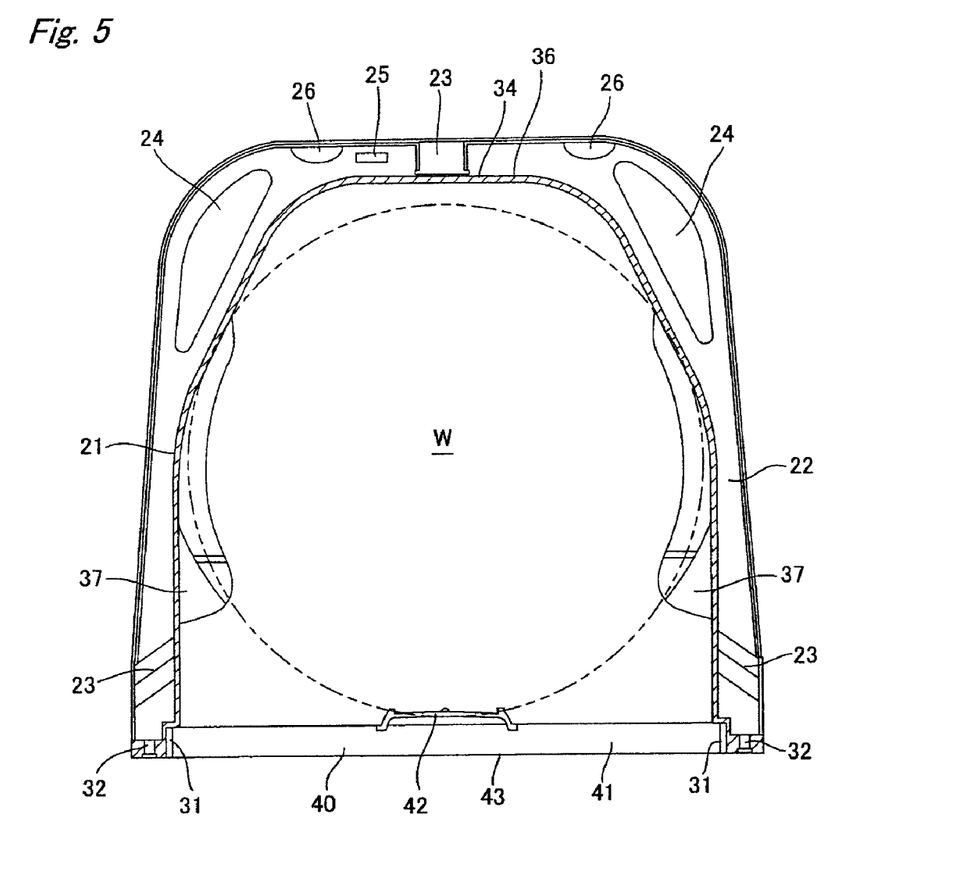
FIG. 5 is a horizontally sectional illustrative view schematically showing a substrate storage container in an embodiment of an injection molding die and injection molding method according to the present invention.
Figure 6:
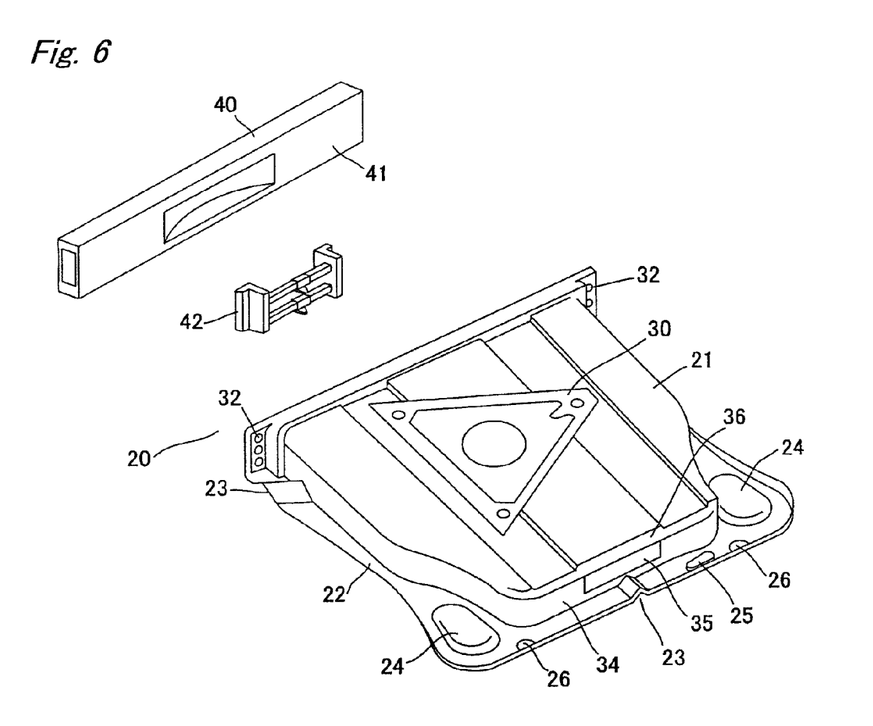
FIG. 6 is a rear perspective view schematically showing a substrate storage container in an embodiment of an injection molding die and injection molding method according to the present invention.

An IC tag 25 for a RFID system as the moving object identifying equipment is selectively attached from the center to one side in the rear of bottom plate 22 while a plurality of draining holes 26 functioning when container body 21 is rinsed are formed at intervals of a predetermined distance (see FIGS. 5 and 6). These IC tag 25 and draining holes 26 may be provided as many as required, at the front, in the rear or on the sides of bottom plate 22, as required.

As shown in FIGS. 3, 4, 6 and 7, the top of container body 21 is formed in an approximately polygonal shape having a plurality of steps when viewed from the top, with the rear part on both sides formed inwardly inclined correspondingly to the rear-side periphery of semiconductor wafer W. In the central part on the top of this container body 21, a cylindrical attached rib 27 is formed upright and a plurality of approximately plate-like reinforcing ribs 28 are formed upright and extended radially outwardly from the outer peripheral side of the attached rib 27. Each reinforcing rib 28 has a cylindrically formed distal end, in which a screw hole 29 is formed. A suspending flange 30 for transportation is screw fitted to the attached rib 27 and plural screw holes 29 by fasteners such as screws etc.

Suspending flange 30 is given in the form of an approximately triangular flat plate, viewed from the top, and is detachably gripped from above by an unillustrated conveyor. Then, the flange is fitted with and held by a slidable suspending plate of the semiconductor processing equipment, so that substrate storage container 20 is set in a suspended position on the processing equipment.

Figure 4:
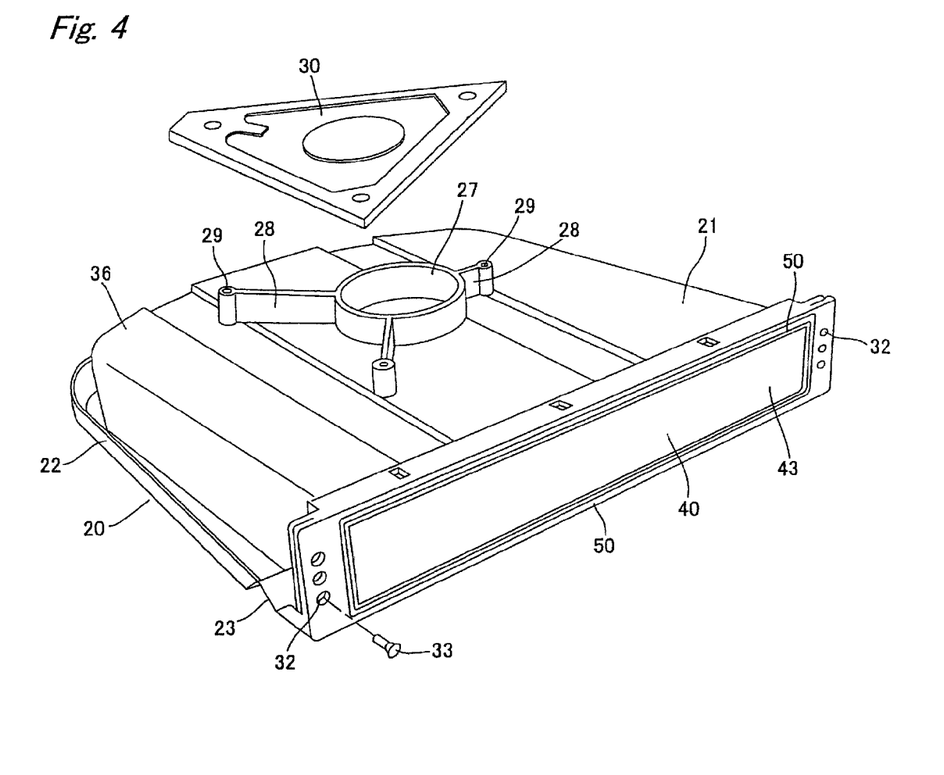
FIG. 4 is an exploded perspective illustrative view schematically showing a substrate storage container in an embodiment of an injection molding die and injection molding method according to the present invention.
Figure 7:
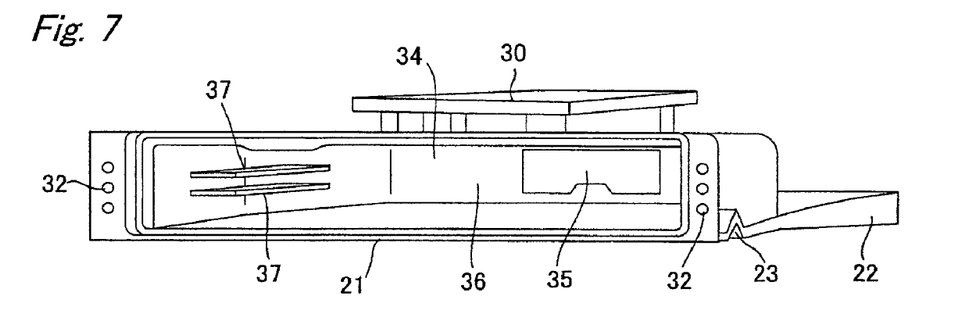
FIG. 7 is a front perspective illustrative view schematically showing a container body of a substrate storage container in an embodiment of an injection molding die and injection molding method according to the present invention.

As shown in FIGS. 4, 6 and 7, substrate storage container 21 has a laterally long rectangular opening formed on the front side and a vertically long locking slot 31 for door element 40 is cut out on either side on its interior periphery. A plurality of round identification holes 32 are formed in a vertical row on both sides in the front side of container body 21. Detachable identification pieces 33 are selectively fitted into these plural identification holes 32 so as to allow the processing equipment to identify the type of substrate storage container 20, the presence or absence, or the number etc., of semiconductor wafers W.

As shown in FIG. 4, identification pieces 33 are given in a pin-shaped, split pin-shaped, screw-shaped, cap-shaped form or the like, and detected by a detecting means of the processing equipment, for instance, a transmission-type or reflection-type photoelectric sensor, photo sensor, touch sensor or the like.

As shown in FIGS. 5 to 7, a laterally long rectangular transparent observation window 35 is formed in part of backside wall 34 of container body 21, for example in the central part of backside wall 34. This observation window 35 is used by the observer to check the presence or absence and the condition of accommodated semiconductor wafers W. Observation window 35 may be formed in a round, oval, polygonal shape or the like, as necessary.

Formed on the interior surface on both side walls of container body 21 are a pair of left and right teeth 37 for horizontally supporting semiconductor wafer W. Plural pairs of left and right teeth 37 are arranged vertically at intervals of a predetermined distance. These plural pairs of teeth 37 accommodate semiconductor wafers W, vertically in alignment.

Each tooth 37 is integrally formed of, for example a flat plate formed in an approximately semi-circular arc shape, when viewed from the top, so as to go along the periphery of semiconductor wafer W, a front medium thickness area formed on the curved, front and interior part of the flat plate, a front thick area formed on the front outer side of the flat plate and located outside the front medium thickness area, or close to the side wall of container body 21, and a rear medium thickness area formed on the rear part of the flat plate.

The thus constructed teeth 37 have a slight step for coming in contact with the semiconductor wafer, formed between the front medium thickness area and the front thick area, so that the front medium thickness area and the rear medium thickness area support semiconductor wafer W approximately horizontally while the front thick area functions as a stopper for preventing the accommodated semiconductor wafer W from slipping out. Adoption of the thus constructed teeth 37 improves the precision of the supporting and mounting position of semiconductor wafers W and can effectively prevent semiconductor wafers W from being vertically tilted when they are supported.

As shown in FIGS. 3 to 7, door element 40 includes a laterally long casing 41 having an approximately dish-like section, detachably fitted to the open front of container body 21, a laterally long surface plate 43 that detachably covers the open front of this casing 41, and a locking mechanism built in casing 41 and covered by surface plate 43. On the rear side of casing 41, an elastic front retainer 42 for elastically holding a plurality of semiconductor wafers W in the front periphery is detachably attached.

Though not illustrated, the locking mechanism includes, for example, a pair of drive shafts that are supported on both sides inside casing 41 by supporting pieces so as to slide inwards and outwards, engaging claws which each are fitted on the distal part of the drive shaft and can be projected and retracted to interfere with locking slots 31 of container body 21, stoppers that are attached to the terminal end of each drive shaft to restrain excess slide, and coil springs that are fitted through each drive shaft to cause the engaging claws to penetrate through the side peripheral wall portion of casing 41, and robustly locks door element 40 fitted to the front of container body 21. A roller that will be in contact with the interior of locking slot 31 of container body 21 may be rotatably axled at the distal end of each engaging claw so as to prevent generation of particles accompanied by contact with the engaging claw.

As shown in FIG. 4, gasket 50 is given as an endless frame-shaped molding of fluoro rubber, silicone rubber or the like, and is held between the inner periphery in the front of container body 21 and the peripheral portion of casing 41 forming door element 40 to provide an air-tight function by its compression deformation to thereby prevent semiconductor wafer W from being contaminated and generation of particles.

As shown in FIG. 5, semiconductor wafer W is given as a thin round disk slice having a size of 12 inches, for instance, so as to allow for efficient production of IC chips and is selectively laminated on the surface with coatings such as oxide film etc.

In the above, when container body 21 of substrate storage container 20 is molded, first, insert part 10 that forming rear part 36 of container body 21, which has been molded beforehand, is fitted to and supported on the front end of core 7 of core mold 6 in the unclamped mold. Then, core mold 6 is inserted into hollow portion 3 of cavity mold 2 so as to insert the insert part 10 until insert part 10 comes into contact with the rear of opposing wall 4, and then die 1 is clamped.

When die 1 has been mold-clamped in the above way, the molten molding material is injected into die 1 so as to form a hollow container body 21 having insert part 10 integrally formed in rear part 36 by injection molding. Then, die 1 is cooled while being clamped under pressure. Thereafter, cavity mold 2 and core mold 6 of die 1 are unclamped, and container body 21 is pushed out to fall by means of elector pins and ejector plates and transported by special robots so as to be able to obtain container body 21.

In the above configuration, since insert part 10 supported on the front end of core 7 of core mold 6 is brought into contact with hollow portion 3 of cavity mold 2 so as to restrain vibration of the free end of flat core 7, there is no risk that core 7 of core mold 6 that is inserted in cavity mold 2 is flapped or flexed even if there occur variations in the injection pressure of the fluid molding material.

As a result, there no longer occurs any variation in the wall thickness of top, bottom and left and right parts of molded container body 21, and it is possible to markedly effectively prevent core 7 of core mold 6 from being vibrated and broken. Further, insert part 10 is not merely supported by the front end of core 7, but insert part 10 is fitted in so that its position and posture can be stabilized. It is hence possible to mold container body 21 of high quality.

Figure 8:
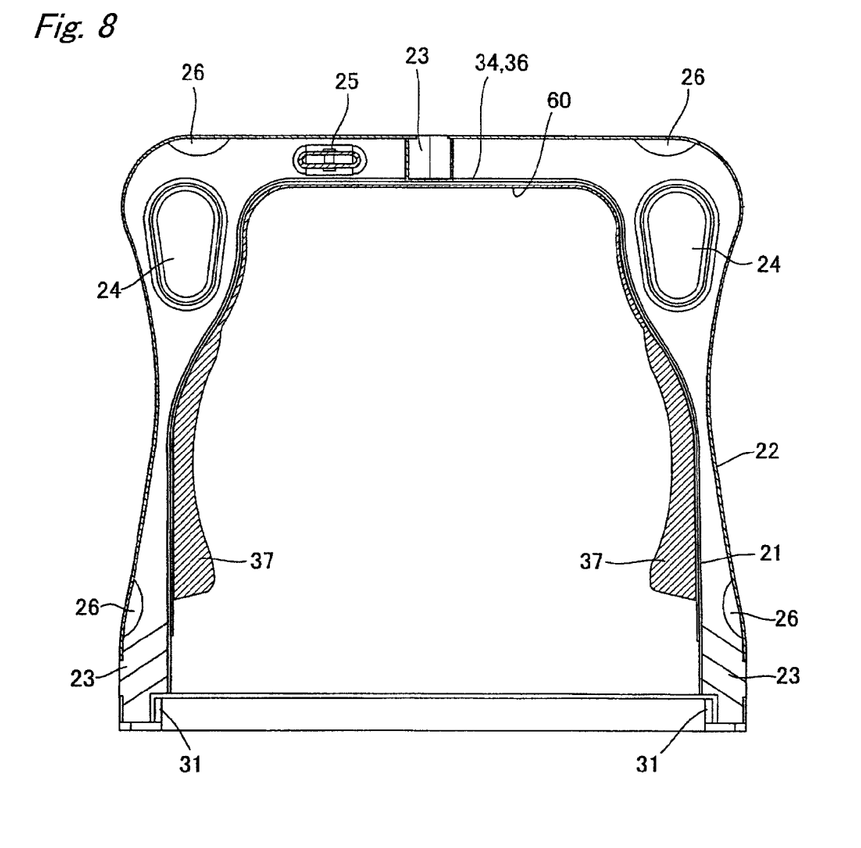
FIG. 8 is a horizontally sectional illustrative view schematically showing a container body of a substrate storage container in a second embodiment of an injection molding die and injection molding method according to the present invention.
Figure 9:
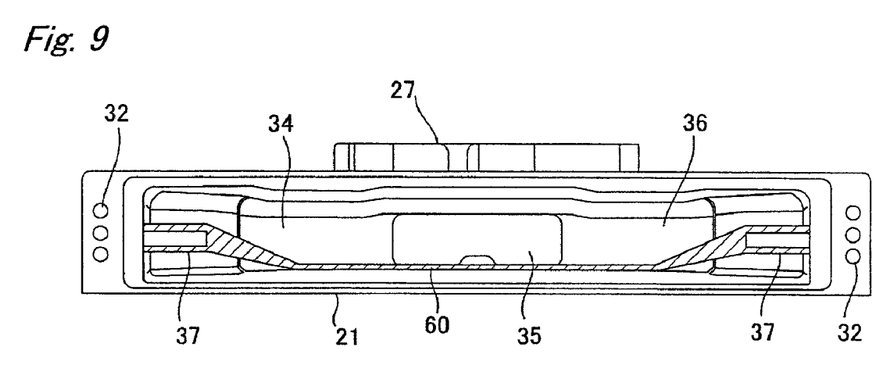
FIG. 9 is a front illustrative view schematically showing a container body of a substrate storage container in a second embodiment of an injection molding die and injection molding method according to the present invention.

Next, FIGS. 8 and 9 shows the second embodiment of the present invention. In this case, the hollow container body 21 and plural pairs of teeth 37 are not integrated but separated from each other, so that plural pairs of elastic teeth 37 are fitted into, and assembled with, molded container body 21 afterward.

Fitting grooves for fitting a plurality of teeth 37 are continuously incised on the backside of the inner bottom and on both the interior side walls of container body 21. Plural pairs of teeth 37 are fitted into the fitting grooves so that pairs of left and right teeth 37 that go along the side periphery of semiconductor wafers W are arranged vertically while their rear parts are fitted in the fitting grooves and connected by an elongate joint piece 60 that is inclined to avoid interference with observation window 35 and the rear periphery of semiconductor wafers W, forming an approximately U-shaped configuration when viewed from the top. Other components are the same as the above embodiment, so that description is omitted.

Also in the present embodiment, the same operational effect as in the above embodiment can be expected. In addition, since container body 21 and teeth 37 are constructed separately, it is apparent that the configuration complexity of die 1 can be avoided and the flexibility of the configuration of teeth 37 can be markedly improved.

Figure 10:
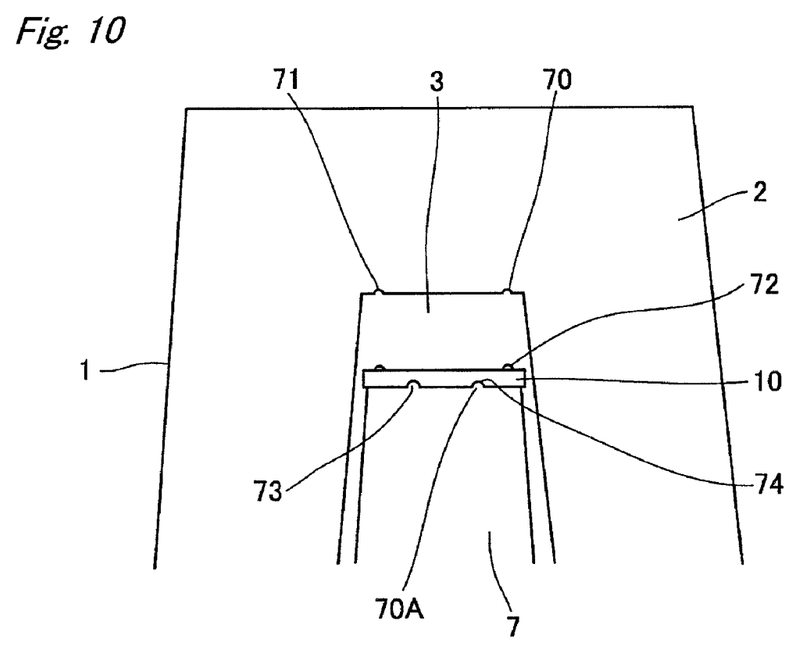
FIG. 10 is a front illustrative view schematically showing a container body of a substrate storage container in a third embodiment of an injection molding die and injection molding method according to the present invention.

Next, FIG. 10 shows the third embodiment of the present invention. In this case, a plurality of mating anti-shift portions 70 are formed in the contact area between hollow portion 3 of cavity mold 2 and insert part 10 while a plurality of anti-shift portions 70A are formed in the contact area between the front end of core 7 and insert part 10.

The multiple mating anti-shift portions 70 include a pair of recesses 71 arranged a predetermined distance apart in mirror-polished hollow portion 3 and a pair of projections 72 arranged a predetermined distance apart in insert part 10. These paired recess 71 and projection 72 oppose and function to mate each other when die 1 is mold-clamped.

The multiple anti-shift portions 70A include a pair of projections 73 arranged a predetermined distance apart in the attachment position of the front end of core 7 and a pair of recesses 74 arranged a predetermined distance apart in insert part 10. These paired projection 73 and recess 74 oppose and mate each other. Other components are the same as the above embodiment, so that description is omitted.

Also in the present embodiment, the same operational effect as in the above embodiment can be expected. In addition, since a plurality of anti-shift portions 70 and 70A mating each other are used, it is apparent that not only insert part 10 that has an approximately U-shaped section but also insert part 10 of a configuration having an approximately I-shaped section, a plate-like configuration or the like, can be used to prevent core 7 of core mold 6 from being flapped and flexed. It is also obvious that mating between a pair of recess 71 and projection 72 makes it possible to effectively prevent insert part 10 from swaying due to difference of the injected pressure of the molding material. Further, it is possible to realize stable support by preventing displacement of insert part 10 by use of the mating between a pair of projection 73 and recess 74.

Though in the above embodiment, container body 21 with its rear part 36 formed by insert part 10 was illustrated, the configuration is not limited to this. For example, as long as the same operational effect can be obtained, a molding article with its front part or side part formed with insert part 10 may be molded. Alternatively, instead of providing insert part 10 in the middle of rear part 36 of container body 21, two insert parts may be provided apart from each other in rear part 36. Further, insert part 10 may also be molded of a molding material containing an opaque or translucent resin in a shape fittable to core 7 of core more 6.

Further, container body 21 may be constructed so as to accommodate only one or three semiconductor wafers W. Though container body 21 and bottom plate 22 may be integrated, they may be given as separate structures. Suspending flange 30 may given in a flat round form, polygonal form or the like, or may attached to both flanks etc. of container body 21 in a detachable manner. Further, the engaging claw of the locking mechanism of door element 40 may be constructed so as to be exposed from the top or bottom of the peripheral wall of casing 41, so as to robustly lock door element 40 fitted to the front of container body 21.

The invention claimed is:

1. An injection molding die for molding a hollow molding article that has, at least, part of externals formed with an insert part having an approximately U-shaped body as a whole, by inserting the insert part into the die, clamping the die, and injecting a molding material into the mold-clamped die, the die comprising: a first mold having a hollow portion and a second mold with a core having a projection extended and fitted into the hollow portion of the first mold, wherein the approximately U-shaped body of the insert part wraps around and is supported by an end part of the projection of the core of the second mold and brought into contact with the hollow portion of the first mold to restrain the core of the second mold from being flapped when the molding material is injected, wherein the molding article is a container body of a front open box type with a laterally long opening capable of accommodating three substrates or less, and wherein the insert part comes into contact with a rear of an opposing wall constituting the hollow portion of the first mold so as to form a rear part of the container body.

2. The injection molding die according to claim 1, wherein mating anti-shift portions are formed in the contact area between the hollow portion of the first mold and the insert part.

3. The injection molding die according to claim 1, wherein anti-shift portions are formed in the contact area between the core of the second mold and the insert part.

4. The injection molding die according to claim 1, wherein the rear part of the container body, which partly includes a see-through backside wall, is formed by the insert part.

5. The injection molding die according to claim 1, wherein the insert part is molded of a molding material containing transparent resin into a shape that is fittable to the core of the second mold.

6. An injection molding method comprising:

configuring a molding die to mold a hollow molding article that has, at least, part of externals formed with an insert part having an approximately U-shaped body as a whole, by inserting the insert part into the die, clamping the die, and injecting a molding material into the mold-clamped die, wherein the molding die comprises a first mold having a hollow portion and a second mold with a core having a projection extended and fitted into the hollow portion of the first mold, wherein the approximately U-shaped body of the insert part wraps around and is supported by an end part of the projection of the core of the second mold and brought into contact with the hollow portion of the first mold to restrain the core of the second mold from being flapped when the molding material is injected, wherein the molding article is a container body of a front open box type with a laterally long opening capable of accommodating three substrates or less, and wherein the insert part comes into contact with a rear of an opposing wall constituting the hollow portion of the first mold so as to form a rear part of the container body.

7. The injection molding die according to claim 2, wherein anti-shift portions are formed in the contact area between the core of the second mold and the insert part.

8. The injection molding die according to claim 4, wherein the insert part is molded of a molding material containing transparent resin into a shape that is fittable to the core of the second mold.

9. An injection molding method comprising:

configuring a molding die to mold a hollow molding article that has, at least, part of externals formed with an insert part having an approximately U-shaped body as a whole, by inserting the insert part into the die, clamping the die, and injecting a molding material into the mold-clamped die, wherein the molding die comprises a first mold having a hollow portion and a second mold with a core having a projection extended and fitted into the hollow portion of the first mold, wherein the approximately U-shaped body of the insert part wraps around and is supported by an end part of the projection of the core of the second mold and brought into contact with the hollow portion of the first mold to restrain the core of the second mold from being flapped when the molding material is injected, and wherein the molding article is a container body of a front open box type capable of accommodating three substrates or less, and the rear part of the container body, which partly includes a see-through backside wall, is formed by the insert part, and wherein the insert part comes into contact with a rear of an opposing wall constituting the hollow portion of the first mold so as to form a rear part of the container body.

* * * * *